United States Patent [19]

Morris et al.

[11] Patent Number: 4,507,709

[45] Date of Patent: Mar. 26, 1985

[54] ELECTRICAL INTERCONNECT ARRANGEMENT FOR A GFCI MAGNETIC SENSOR MODULE PLUG-IN SUBASSEMBLY

[75] Inventors: Robert A. Morris; George W. Kiesel, both of Burlington; Paul T. Rajotte, Plainville; Anthony L. Richards, Southington, all of Conn.

[73] Assignee: General Electric, New York, N.Y.

[21] Appl. No.: 579,336

[22] Filed: Feb. 13, 1984

[51] Int. Cl.[3] .............................................. H05K 1/11

[52] U.S. Cl. ................................ 361/400; 29/602 R; 174/53; 336/174; 336/192; 336/195; 361/395; 361/417

[58] Field of Search .................... 361/45, 46, 47, 334, 361/392-395, 400-404, 417-419, 331; 174/53; 336/174, 175, 195, 192, 82; 29/602 R; 335/18

[56] References Cited

U.S. PATENT DOCUMENTS

| | | | |
|---|---|---|---|
| 3,268,843 | 8/1966 | Popp | 336/175 |
| 4,350,856 | 9/1982 | Shiratori et al. | 361/400 |
| 4,412,193 | 10/1983 | Bienwald et al. | 335/18 |

*Primary Examiner*—A. D. Pellinen

*Assistant Examiner*—Gregory D. Thompson

*Attorney, Agent, or Firm*—Richard A. Menelly; Walter C. Bernkopf; Fred Jacob

[57] ABSTRACT

A ground fault circuit interrupter interconnect arrangement provides wireless connection with line and neutral main current terminals by insertion through an aperture in the interrupter magnetic sensor module to form a magnetic sensor plug-in subassembly. The electronics components and trip solenoid are mounted to the interrupter printed wire board. The magnetic sensor subassembly is plugged into the printed wire board for interconnection with the electronics components. This allows the interrupter to be assembled in a completely automated process.

17 Claims, 6 Drawing Figures

ELECTRICAL INTERCONNECT ARRANGEMENT FOR A GFCI MAGNETIC SENSOR MODULE PLUG-IN SUBASSEMBLY

BACKGROUND OF THE INVENTION

Ground fault circuit interrupting (GFCI) devices, as currently available, are capable of interrupting fault current in the range of 4 to 6 milliamps. Circuits for such devices are described in U.S. Pat. Nos. 4,345,289 and 4,348,708, both of which are in the name of Edward K. Howell. The circuits described therein basically include a current sensor or magnetics, a signal processor or electronics and an electronic switch. The magnetics consist of a differential current transformer which responds to a current imbalance in the line and neutral conductors of the distribution circuit. This current imbalance is amplified by the signal processor pursuant to triggering the electronic switch and thereby complete an energization circuit for the trip solenoid. The current sensor also includes a neutral excitation transformer for responding to a ground fault on the neutral conductor.

A mounting arrangement for the GFCI device is described in U.S. Pat. Nos. 3,950,667 and 4,001,652 to Keith W. Klein et al. In the Klein et al GFCI device, the signal processor electronics is carried on a printed wire board and is positionally mounted and retained in one shell compartment of a GFCI receptacle casing. The magnetics are positionally mounted in another shell compartment within the receptacle and are locked in place by the insertion of single turn transformer winding elements. This GFCI assembly, although compact, does not readily lend to a fully automated assembly process since the magnetics contain two separate transformers which require electrical interconnection with each other as well as with the circuit electronics. To date, the electrical interconnection of the magnetics with the electronics has accounted for a good percentage of the time involved in the GFCI assembly process.

The purpose of this invention is to provide a wireless connection between the GFCI line and neutral terminals and the magnetic sensor module which contains both the differential current transformer and neutral excitation transformer in a single unitary structure. This results in a magnetic sensor plug-in subassembly which allows the electrical interconnection between the magnetic sensor module and the electronics printed wire board to be completely automated.

SUMMARY OF THE INVENTION

A GFCI device is adapted for completely automated assembly by a pre-assembled magnetic sensor module consisting of a unitary arrangement of the neutral excitation transformer and differential current transformer and an interconnect arrangement which allows plug-in connection of the magnetic sensor module with the printed wire board electronics. The interconnect arrangement consisting of in-line concentric tubular connectors and insulators allows the magnetic sensor module to be robotically interconnected with the circuit electronics without additional wiring.

GENERAL DESCRIPTION OF THE INVENTION

Figure 1:
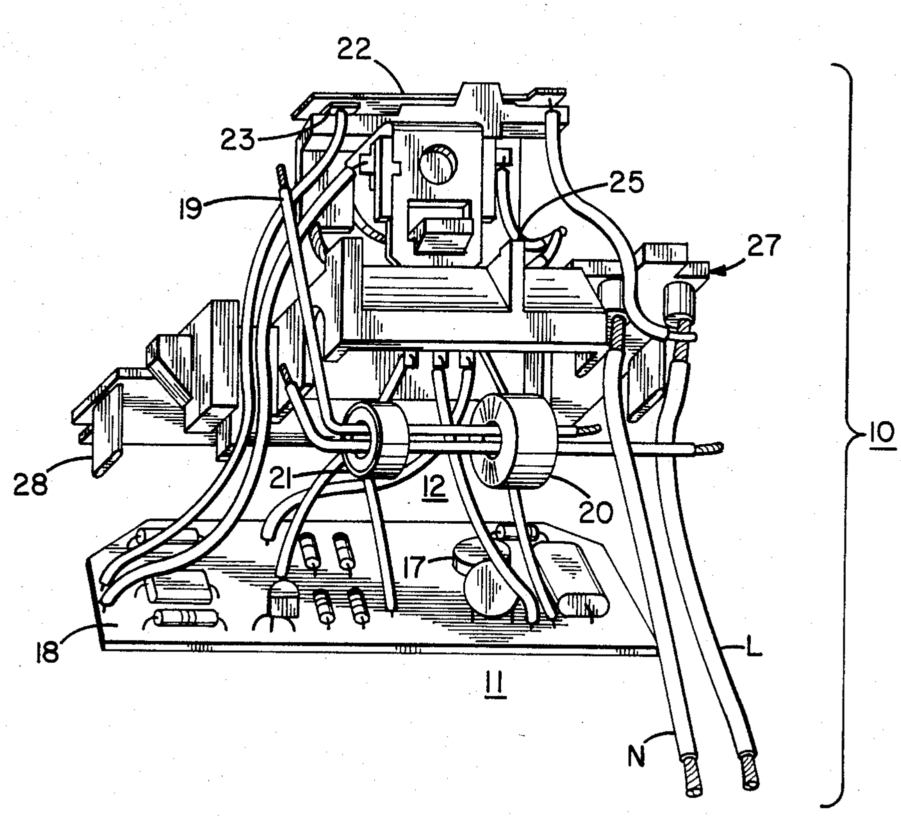
FIG. 1 PRIOR ART
FIG. 1 is a top perspective view of a GFCI assembly according to the prior art.
Figure 2:
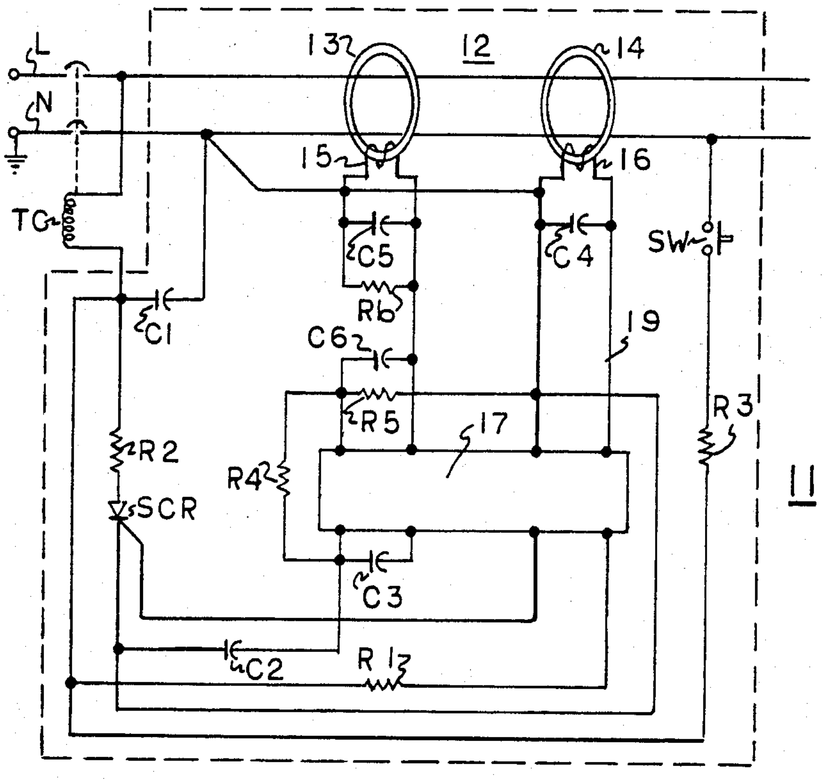
FIG. 2 PRIOR ART
FIG. 2 is an electrical schematic of the signal processor electronics used within the GFCI of FIG. 1.

The electrical interconnect arrangement of the invention for allowing plug-in of a magnetic sensor module within an automated GFCI device can be better understood by referring first to the state of the art GFCI device 10 depicted in FIG. 1 and the electronics module 11 depicted in FIG. 2. The electronics module is described in detail in the aforementioned patents to Howell which are incorporated herein for purposes of reference. The magnetics 12 consists of a differential current transformer core 13 and a neutral transformer core 14 for encircling the line and neutral conductors L, N. The differential transformer secondary winding 15 and the neutral excitation transformer secondary winding 16 interconnect with an amplifier chip 17 for amplifying the ground fault currents detected and for operating an SCR and trip coil solenoid TC to open the switch contacts. A plurality of discrete circuit elements such as capacitors $C_1$–$C_6$ and resistors such as $R_1$–$R_6$ are required for current limitation and noise suppression. A test switch SW is used for directly connecting the trip coil solenoid through a current limiting resistor, such as $R_3$, whereby the circuit between the line and neutral conductors is complete and the switch contacts are opened to test the circuit.

The arrangement of the electronics module 11 within the prior art GFCI device 10 is provided by means of a printed wire board 18 which carries the discrete elements such as the resistors, capacitors, SCR and the amplifier chip 17. The electronics module 11 is interconnected with the magnetics 12 by means of a plurality of wires generally indicated as 19. The magnetics consisting of differential current transformer 21, containing core 13 and winding 15, and neutral excitation transformer 20 containing core 14 and winding 16, are secured to the underside of a mounting platform 27. The line and neutral conductors L, N connect with the magnetics 12, electronics module 11 and with the switch SW consisting of movable and fixed contacts 22, 23 supported on the mounting platform 27 by means of a pedestal 25. The TC solenoid is mounted subjacent the movable and fixed contacts 22, 23 and operates to open the contacts upon the occurrence of ground fault current through either or both of the transformers. Four posts 28 depending from the bottom of the mounting platform 27 provide requisite clearance between the mounting platform and the bottom case (not shown) of the device for the printed wire board 18.

It was determined that by concentrically arranging the differential current transformer 21 and the neutral excitation transformer 20 in a compact assembly around a common aperture, the pedestal 25 and mounting platform 27 could be eliminated and the magnetics 12 could then be directly mounted to the printed wire board 18 eliminating the connecting wires 19. Further, the line and neutral conductors L, N could be sensed by tubular conductors through the assembly aperture, without the need for passing the conductors through the centers of the neutral excitation and differential current transformers as with the prior art.

DESCRIPTION OF THE PREFERRED EMBODIMENT

Figure 3:
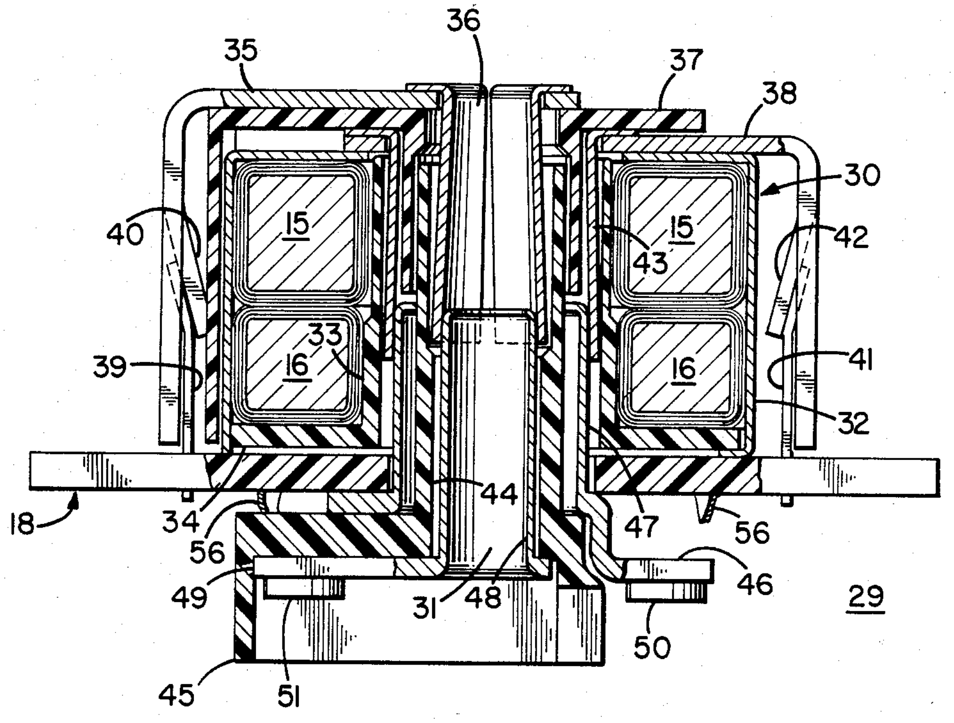
FIG. 3 is a front view in partial section of the magnetic sensor module plug-in assembled with the printed circuit board subassembly according to the invention.

The GFCI plug-in subassembly 29 consisting of a magnetic sensor module 30 mounted on the electronics printed wire board 18 is shown in FIG. 3. The discrete electrical components are omitted from the electronics printed wire board 18 for purposes of clarity. The differential current transformer winding 15 is shown above the neutral excitation winding 16 around the common central opening 31 and contained within a metallic closure 32. The magnetic sensor module 30 which includes windings 15, 16, is arranged around an insulating cylinder 33 inserted within central opening 31 through the magnetic sensor module. The insulating cylinder 33 extends upwards within the central opening to provide further support to the magnetic sensor module 30 and to insulate the magnetic sensor module from the electronics printed wire board 18 by means of the insulating pedestal 34. The magnetic sensor module 30 is fully described in copending U.S. patent application Ser. No. 579,337 which application is incorporated herein for reference purposes. A connecting strap 38 which includes a split tube connector 43 is mounted on the magnetics module 30 by inserting the split tube connector within central opening 31. An insulating ferrule 37 separates the connecting strap 38 from another connecting strap 35 which is supportedly mounted on magnetic sensor module 30 by the insertion of split tube connector 36 within the central opening. Electrical connection between connecting strap 35 and the electronics printed wire board 18 is made by capturing a pin connector 39 extending from the wire board within the lanced tab 40 extending at an angle from connecting strap 35. Electrical connection between connecting strap 38 and the electronics printed wire board 18 is made by capturing a similar pin connector 41 with the lanced tab 42 extending at an angle from connecting strap 38. Connecting strap 38 is mounted on the electronics printed wire board 18 and magnetic sensor module 30 by means of tube connector 43. An insulating tube 44 and insulating cover 45 electrically insulated neutral strap 46 and tube connector 47 from a similar tube connector 48 and line strap 49. The neutral fixed contact 50 is attached to the bottom of neutral strap 46 and the line fixed contact 51 is attached to the bottom of line strap 49. Arranging the sequence of assembling the component parts of the GFCI allows the components to be assembled in a fully automated process.

Figure 4:
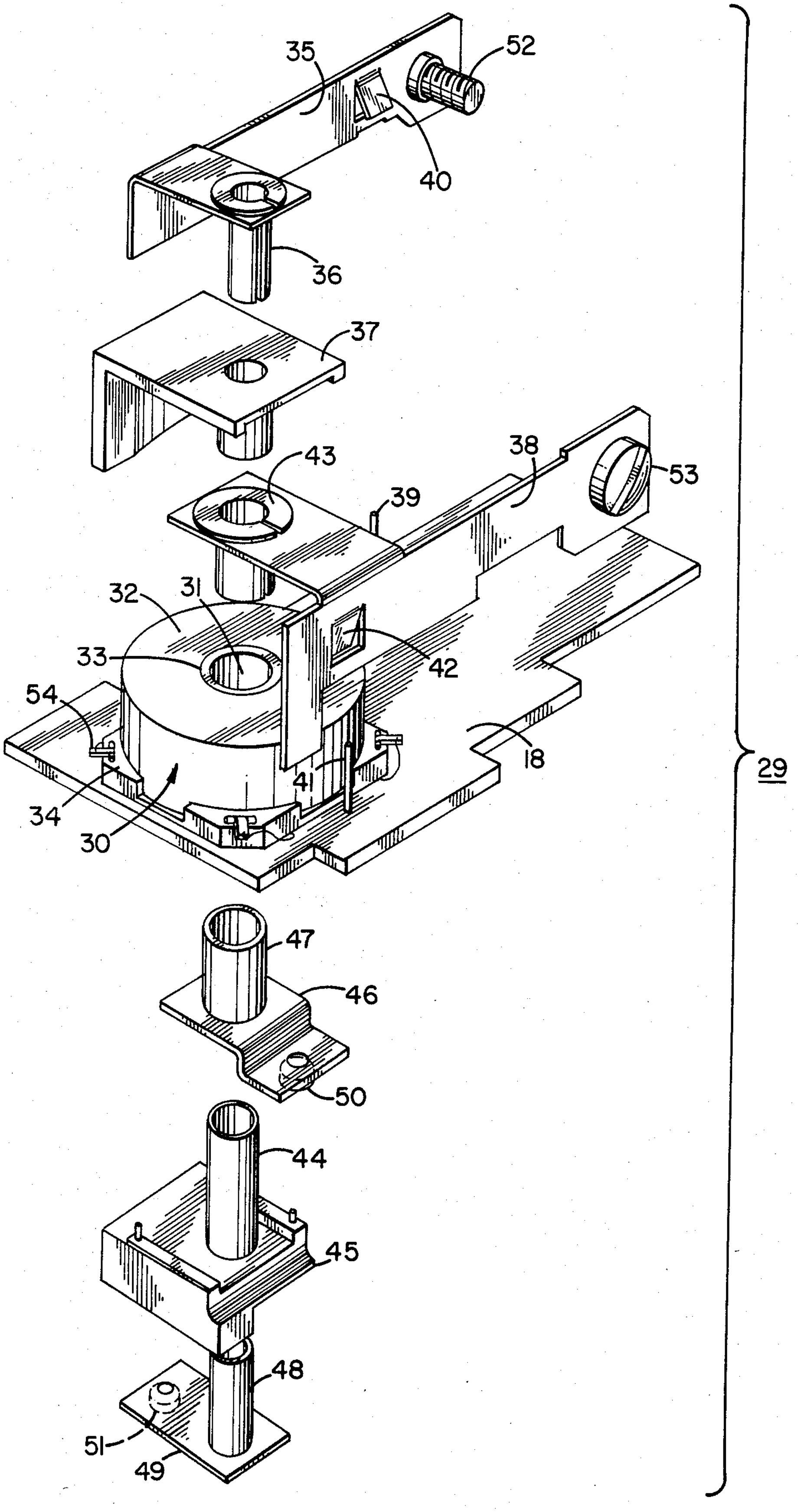
FIG. 4 is an exploded top perspective view of the components contained within the GFCI magnetic sensor module depicted in FIG. 3.
Figure 6:
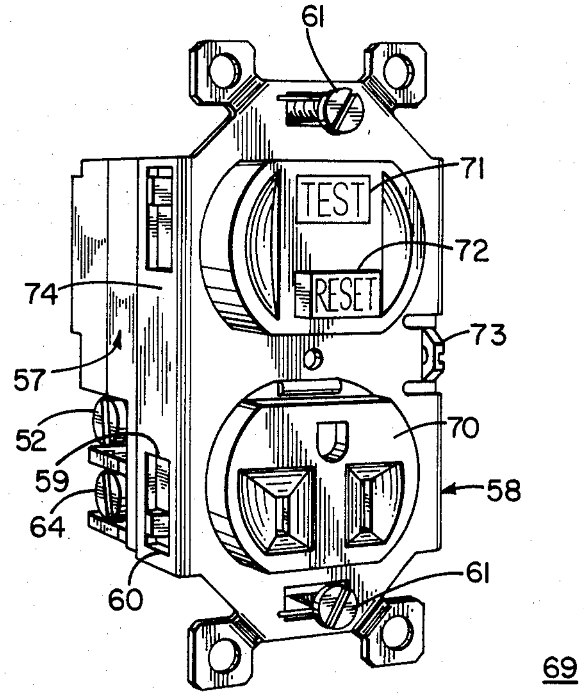
FIG. 6 is a front perspective view of the completed GFCI assembly.

FIG. 4 shows the sensor module plug-in subassembly 29 prior to engagement between all the connecting and insulating elements. Binding screws 52, 53 are provided in connecting straps 35, 38 for electrically installing the fully assembled GFCI receptacle as depicted in FIG. 6. The insulating ferrule 37 electrically insulates split tube connectors 36 and 43. In some GFCI designs, insulating ferrule 37 is provided with additional insulation between connecting strap 35 and the metallic enclosure 32 of sensor module 30 for added electrical insulation between line and neutral potentials. Assembly is made by first inserting the split tube connector 36 within the insulating ferrule and then within split tube connector 43 before insertion within the magnetic sensor module central opening 31. In the assembly process, pin connectors 39 and 41 automatically align and connect with lanced tabs 40 and 42. This arrangement eliminates several wiring connections and is an important feature for allowing automated assembly of the plug-in subassembly 29.

The plug-in subassembly 29 provides automatic interconnection and alignment between the various components in the following manner. The connecting strap 35 electrically connects with line strap 49 by contact between split tube connector 36 and tube connector 48 as well as with the electronics within the printed wire board 18 by connection between the lanced tab 40 on the connecting strap with the pin connector 39 on the electronics printed wire board. Connecting strap 38 electrically connects with neutral strap 46 by connection between the split tube connector 43 and the tube connector 47 as well as with the electronics within the printed wire board 18 by means of connection between the lanced tab 42 on the connecting strap 38 with the other pin connector 41 extending from the electronics printed wire board. Electrical connection between the neutral excitation transformer and differential current transformer within magnetic sensor module 30 and the electronics within the printed wire board 18 is made by means of the pin connectors 54 extending through the magnetic sensor module insulating pedestal 34, as well as by connection between plugs 56 inserted through the printed wireboard 18 as best seen in as best seen in FIGS. 3 and 4. A detailed description of the connection between the magnetic sensor module and the printed wireboard can be obtained by referring to the aforementioned U.S. patent application. Electrical connection between the line and neutral conductors is made by attaching the neutral conductor to binding screw 53 in connecting strap 38 and the line conductor to binding screw 52 in connecting strap 35 when the completed GFCI device is connected within the customer's electric power distribution system. This advantageously eliminates feeding the line and neutral conductors through the sensor module since the split tube conductors 43, 36 and tube connectors 47, 48 which extend within the central opening 31 of the magnetic sensor module 30 provide the primary windings for both the neutral excitation transformer and the differential transformer contained within the magnetic sensor module.

Figure 5:
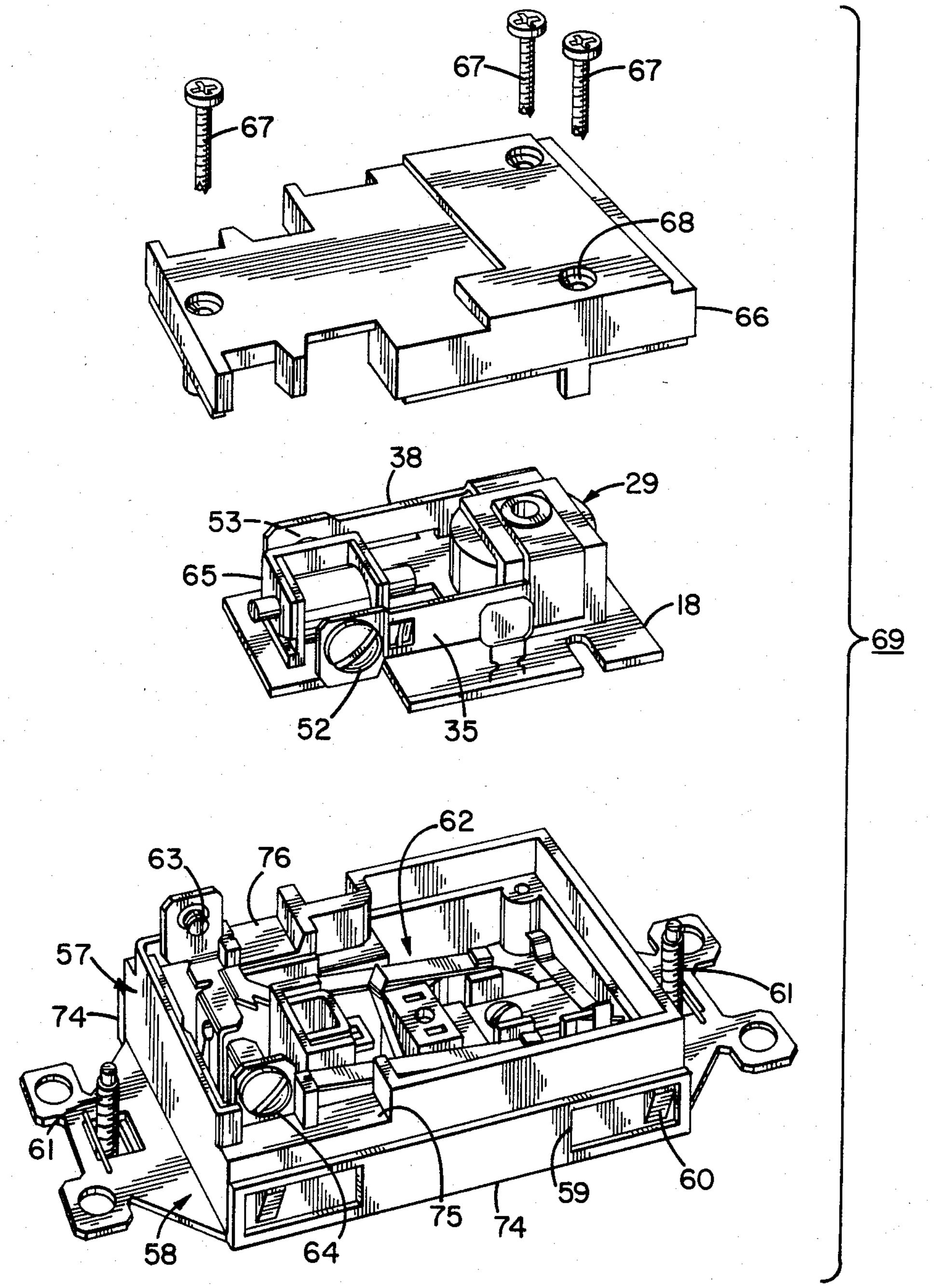
FIG. 5 is an exploded perspective view of the back case magnetic sensor module and GFCI subassembly according to the invention.

The magnetic sensor subassembly 29 is shown in FIG. 5 plugged into the printed wire board 18. Also shown mounted on the wire board is the trip solenoid 65 located between the line and neutral terminal screws 52, 53. The magnetic sensor module subassembly and printed wire board are placed within the GFCI case 57 and cover 66 is then positioned over the case and screws 67 are inserted through holes 68 to attached the cover to the case and complete the assembly. The mechanism assembly shown generally at 62 is the subject of U.S. patent application Ser. No. 579,627 which application is incorporated herein for purposes of reference. Details concerning the operation of the mechanism assembly can be obtained by referring to this application. Prior to mounting the mechanism assembly within case 57, yoke 58 is attached to the case by fitting slots 59 which are formed within the yoke side rails 74 over corresponding projections 60 formed in the case. Yoke 58 has mounting screws 61 for ease in attaching the GFCI device. A neutral terminal screw slot 76 and a line terminal screw slot 75 are formed on opposite sides of the case and are located such that the line terminal and neutral terminal screws 52, 53 are accessible when the printed wire board 18 and magnetic sensor module subassembly 29 are inserted within the case.

The completely assembled GFCI device 69 is shown in FIG. 6 with a test button 71 and a reset button 72 arranged above a single outlet receptacle 70 which extend through yoke 58. Both the line terminal screw 52, load line terminal screw 64 and ground terminal screw 73 are conveniently accessible for electrical connection.

It is thus seen that an automated assembly process for GFCI devices is made possible by positioning the magnetic sensor module subassembly 29 within the printed wire board 18 prior to connection with the mechanism assembly 62 already assembled within case 57 as depicted in FIG. 5. The configuration and order of assembly of the components within the magnetic sensor subassembly 29 depicted in FIG. 4 which provide for the electrical interconnection between the magnetic sensor 30 and the printed wire board 18 without the need for wire connections is a key factor in allowing the assembly process to become automated.

We claim:

1. A magnetic sensor plug-in module comprising:

a pair of first and second apertured transformers arranged one over the other;

a first conducting strap having first terminal connecting means and first tubular connection means, said first tubular connection means being inserted within said transformer apertures;

a second conducting strap having second terminal means and second tubular connection means, said second tubular connection means being inserted within said first tubular connection means;

first electrically insulative means intermediate said first and second straps providing electrical isolation between said first and second tubular connection means;

first electric contact means having first insertion means inserted within said transformer apertures for electrical connection with said first tubular connection means and having a first fixed electric contact;

second electric contact means having second insertion means inserted within said first insertion means for electrical connection between said second tubular connection means and having a second fixed electric contact; and second electrically insulative means intermediate said first and second electric contact means providing electrical isolation between said first and second insertion means;

said first conducting strap thereby electrically connecting with said first contact means and said second conducting strap thereby electrically connecting with said second contact means for transferring first and second currents between said first and second terminal connecting means and said first and second fixed electric contacts through said transformer apertures.

2. The sensor plug-in module of claim 1 wherein said first tubular connection means comprises a first metal tubular conductor having a first diameter and said second tubular connection means comprises a second metal tubular conductor having a second diameter.

3. The sensor plug-in module of claim 2 wherein said first insertion means comprises a first metal tubular conductor having a diameter sized for a press-fit connection with said first diameter, and said second insertion means comprises a second metal tubular conductor having a diameter sized for a press-fit connection with said second diameter.

4. The sensor plug-in module of claim 2 wherein said first diameter is larger than said second diameter.

5. The sensor plug-in module of claim 2 wherein said first and second metal tubular conductors comprise split cylinders.

6. The sensor plug-in module of claim 1 wherein said first and second conducting straps each include a lanced tab for electrically connecting with a printed wire board.

7. The sensor plug-in module of claim 1 wherein said first and second conducting straps each comprise a unitary metal arangement wherein said first and second terminal means extend in a first plane and said first and second tubular connection means extend in a second plane perpendicular to said first plane.

8. The sensor plug-in module of claim 7 wherein said terminal means comprises a screw.

9. The sensor plug-in module of claim 3 wherein said first and second electric contact means each include a fixed electric contact.

10. The sensor plug-in module of claim 9 wherein said first electric contact means further includes a first base portion supporting said first fixed electric contact on one side of said first base and supporting said first tubular metal conductor on an opposite side of said first base, and said second electric contact means includes a second base portion supporting said second fixed electric contact on one side of said second base and supporting said second metal tubular conductor on an opposite side of said second base.

11. The sensor plug-in module of claim 1 wherein said first and second electrically conductive straps and said first electrically insulative means are attached to one side of said first and second apertured transformers whereby said first and second terminal connecting means are accessible from said one side.

12. The sensor plug-in module of claim 10 wherein said first electric contact base includes a depending step portion and wherein said first fixed contact is arranged on said step.

13. The sensor plug-in module of claim 11 wherein said first and second electric contact means and said second electrically insulative means are attached to an opposite side of said first and second apertured transformers whereby said first and second fixed contacts are accessible from said opposite side.

14. The sensor plug-in module of claim 6 wherein said printed wire board comprises a base extending in said first plane and carrying a plurality of electric components and a pair of contact pins extending in said second plane perpendicular to said first plane.

15. The sensor plug-in module of claim 14 wherein said lanced tabs on said first and second conducting straps capture said contact pins on said printed wire board to provide electrical connection between said first and second conducting straps and said electric components.

16. A method for providing a magnetic sensor plug-in module comprising the steps of:

inserting a first lanced terminal strap tubular connector within one end of an opening extending through a pair of apertured aligned current transformers;

inserting a first electrically insulative ferrule within said first terminal strap tubular connector;

inserting a second lanced terminal strap tubular connector through said insulative ferrule to provide a pair of first and second terminals and a pair of first and second lanced contact tabs accessible from said one end of said opening through said apertured transformers;

inserting a first fixed contact tubular connector through an opposite end of said opening through said apertured transformers;

inserting a second electrically insulative ferrule within said first fixed contact tubular connector; and inserting a second fixed contact tubular connector through said second electrically insulative ferrule to provide a pair of first and second fixed contacts accessible from said opposite end of said opening through said apertured transformers.

17. The method of claim 16 including the steps of:

providing a printed wire board having a pair of electrically conducting pins extending from one surface; and;

capturing said first and second lanced tabs on said first and second terminal straps to provide electrical connection between said terminal straps and said printed wire board.

* * * * *